US012694633B2

(12) United States Patent (10) Patent No.: US 12,694,633 B2

Beltrand et al. (45) Date of Patent: Jul. 28, 2026

(54) METHOD FOR INFERRING A 3D GEOMETRY ONTO A 2D SKETCH

(71) Applicant: DASSAULT SYSTEMES, Velizy Villacoublay (FR)

(72) Inventors: Nicolas Beltrand, Velizy Villacoublay Cedex (FR); Fivos Doganis, Velizy Villacoublay Cedex (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 381 days.

(21) Appl. No.: 18/336,455

(22) Filed: Jun. 16, 2023

(65) Prior Publication Data

US 2023/0410452 A1 Dec. 21, 2023

(30) Foreign Application Priority Data

Jun. 16, 2022 (EP) .................................... 22305878

(51) Int. Cl.

| *G06T 19/20* | (2011.01) |
| *G06F 30/27* | (2020.01) |
| *G06T 15/20* | (2011.01) |

(52) U.S. Cl.

CPC .............. *G06T 19/20* (2013.01); *G06F 30/27* (2020.01); *G06T 15/20* (2013.01); *G06T 2200/24* (2013.01); *G06T 2210/12* (2013.01); *G06T 2219/2016* (2013.01)

(58) Field of Classification Search

CPC ..... G06T 19/20; G06T 15/20; G06T 2200/24; G06T 2210/12; G06T 2219/2016; G06T 2219/2004; G06T 2219/2021; G06T 11/00; G06T 17/10; G06T 17/00; G06T 2200/08; G06F 30/27; G06F 30/12; G06F 30/10

See application file for complete search history.

(56) References Cited

U.S. PATENT DOCUMENTS

| 2005/0231530 | A1* | 10/2005 | Liang ...................... G06T 19/00 345/619 |
| 2014/0229143 | A1* | 8/2014 | Cohen-Or ............... G06T 17/10 703/1 |
| 2015/0332110 | A1* | 11/2015 | Xin ........................ G06T 15/205 345/419 |

(Continued)

FOREIGN PATENT DOCUMENTS

| EP | 3 958 162 A1 | 2/2022 |

OTHER PUBLICATIONS

Partial European Search Report issued Dec. 21, 2022 in European Patent Application No. 22305878.5, 21 pages.

(Continued)

*Primary Examiner* — Kent W Chang

*Assistant Examiner* — Johnny T Le

(74) *Attorney, Agent, or Firm* — Oblon, McClelland, Maier & Neustadt, L.L.P.

(57) ABSTRACT

A computer-implemented method for designing at least one 3D model in a 3D scene including receiving a user's 2D sketch and displaying it on a plane, the 2D sketch representing a view of the 3D model to be designed, inferring a 3D primitive based on the 2D sketch, the 3D primitive being oriented and positioned in the 3D scene to match the view, performing a 2D projection of the 3D primitive on the plane, and fitting the 2D projection onto the 2D sketch.

14 Claims, 5 Drawing Sheets

(56)                      References Cited

U.S. PATENT DOCUMENTS

| | | | |
|---|---|---|---|
| 2017/0153926 A1* | 6/2017 | Callegari | G06T 17/10 |
| 2017/0243352 A1* | 8/2017 | Kutliroff | G06T 19/006 |
| 2018/0204376 A1* | 7/2018 | Winnemöller | G06T 19/20 |
| 2020/0311990 A1* | 10/2020 | Chen | G06V 30/387 |
| 2020/0372126 A1* | 11/2020 | Diamond | B62D 65/00 |
| 2021/0195157 A1* | 6/2021 | Stokking | H04N 13/344 |
| 2022/0130104 A1* | 4/2022 | Serry | G06V 40/161 |
| 2022/0335686 A1* | 10/2022 | Rajagopalan | G06T 19/20 |

OTHER PUBLICATIONS

Tsang, S., et al., "A Suggestive Interface for Image Guided 3D Sketching", CHI Conference Proceedings, Human Factors in Computing Systems, XP058264831, DOI: 10.1145/985692.985767, ISBN: 978-1-58113-702-6, vol. 6, No. 1, 2004, pp. 591-598.

Bouagar, S., et al., "On Aligning Shapes", IEEE International Conference on Signal and Image Processing Applications, XP032106911, DOI: 10.1109/ICPSIPA.2011.6144131, ISBN: 978-1-4577-0243-3, 2011, pp. 444-449.

Delanoy, J., et al., "3D Sketching using Multi-View Deep Volumetric Prediction", Proceedings of the ACM on Computer Graphics and Interactive Techniques, XP0584111865, DOI: 10.1145/3203197, vol. 1, No. 1, 2018, pp. 21:1-21:22.

Bonnici, A., et al., "Sketch-based interaction and modeling: where do we stand?", Artificial Intelligence for Engineering Design, Analysis and Manufacturing, XP093004580, ISSN: 0890-0604, DOI: 10.1017/S0890060419000349, vol. 33, No. 4, 2019, pp. 1-20.

\* cited by examiner a) Receiving a user's 2D sketch b) Inferring a 3D primitive c) Performing a 2D projection d) Fitting said 2D projection onto said 2D sketch

METHOD FOR INFERRING A 3D GEOMETRY ONTO A 2D SKETCH

CROSS-REFERENCE TO RELATED APPLICATIONS

This application claims priority under 35 U.S.C. § 119 or 365 to European Application No. 22305878.5, filed Jun. 16, 2022. The entire contents of the above application are incorporated herein by reference

FIELD

The disclosure relates to the field of computers programs and systems, and more specifically to the field of computer-implemented method for designing a three-dimensional (3D) modeled object in a 3D scene. In particular, the disclosure belongs to the sketching field. The present embodiments could be used in any three-dimensional-based CAD software.

BACKGROUND

2D Sketching and 3D modeling are two major steps of industrial design. Sketching is typically done first, as it allows designers to express their vision quickly and approximately. Design sketches are then converted into 3D models for downstream engineering and manufacturing, using CAD tools that offer high precision and editability.

However, design sketching and CAD modeling are often performed by different experts with different skills, making design iterations cumbersome, expensive, and time consuming. Indeed, computing a 3D model starting from a 2D sketch is not an easy task. Depending on the view angle and the perspective chosen for the input 2D sketch, it might be difficult to find the 3D model intended by the user.

For example, a 2D sketch of a rectangle can be a representation of either a 3D cylinder (from a front view) or a cuboid (from any canonical view). Further, the 2D sketch may be imprecisely drawn as its lines may be not smooth or not straight, or its perspective may be unfaithful to the reality. These imprecisions make this problem even harder to solve. Different methods try to address this problem in the prior art.

In "Sketch2CAD" ("Sketch2CAD: Sequential CAD Modeling by Sketching in Context", ACM Trans. Graph., Vol. 39, No. 6, Article 164, December 2020), the user creates objects by sketching the desired shape edits, which are automatically translated to CAD operations. An updated model is produced based on an existing shape and based on input sketch strokes corresponding to predefined operators. The operators which are supported in Sketch2CAD are the following: face extrusion, beveling of a corner, addition/subtraction of a right polyhedron, and sweeping of a cylindrical shape.

The operator type is used to select the base face of the existing shape and curve segmentation maps, based on which the parameters defining the operator are fitted, via an optimization process. However, Sketch2CAD has several drawbacks. The input sketch strokes of an operator must be drawn completely before the updated model can be inferred: there is no progressive feedback.

Thus, if the user is not satisfied by the updated model, he can only correct the inferred CAD instructions, through a cumbersome edition of the operator parameters in a text file (e.g. "AddSweepShape: <plane 1, length 0.23>), which may be complex for non-expert users. Besides, some of the operators, such as the addition/subtraction of a right polyhedron, require complex input sketch strokes in three dimensions, which may be not quickly doable for non-expert users.

Patent application EP3958162A1 discloses a method of 3D design, wherein a neural network takes as an input a 2D sketch, and outputs a 3D model represented by the 2D sketch. Since the neural network is learned for a class of objects having common structural and/or functional features, the 3D model is inferred, i.e. computed, based on a single 2D sketch. Therefore, there is no need to completely draw the sketch.

The 2D sketch is rendered on a plane of the screen and inferred 3D model is rendered in a 3D scene, next to the 2D sketch (cf. FIGS. 10, 11 and 12 of the patent application).

During the inference process, the 2D sketch is continuously cropped and resized such that the input of the neural network is always centered and has a constant size of 256×256 pixels. Therefore, the inferred 3D model takes neither the size of the 2D sketch nor its position in the 3D scene into account.

Thus, in order to match the 2D sketch and the 3D model on a same screen, it would be required to resize and reposition the 3D model in the 3D scene, and change the viewpoint. Such kind of processing does not ease the design process.

D1 (<<A Suggestive Interface for Image Guided 3D Sketching>>, Tsang et al.) relates to an image guided pen-based suggestive interface for sketching 3D wireframe models. 3D models are created by drawing 2D profile curves on orthographic construction planes from different viewpoints.

D2 (<<On Aligning Shapes>>, Bouagar et al.) relates to a method for shape alignment between two shapes, based on a minimum area rectangle.

Therefore, there is a need for providing a user-friendly computer-implemented method for designing a 3D model that can be directly displayed onto the current sketch of the user.

SUMMARY

An object of the present disclosure is a computer-implemented method for designing at least one 3D model in a 3D scene, comprising the steps of:
a) Receiving a user's 2D sketch (1) and displaying it on a plane, said 2D sketch (1) representing a view of the 3D model to be designed;
b) Inferring a 3D primitive (4) based on said 2D sketch (1), said 3D primitive being oriented and positioned in the 3D scene so as to match said view;
c) Performing a 2D projection of the 3D primitive (4) on said plane;
d) Fitting said 2D projection onto said 2D sketch (1).

The disclosure also relates to: a method for designing a set of 3D models, a computer program product, a non-transitory computer-readable data-storage medium and a computer system.

BRIEF DESCRIPTION OF THE DRAWINGS

Additional features and advantages of the present embodiments will become apparent from the subsequent description, taken in conjunction with the accompanying drawings.

DETAILED DESCRIPTION

Figure 1A:
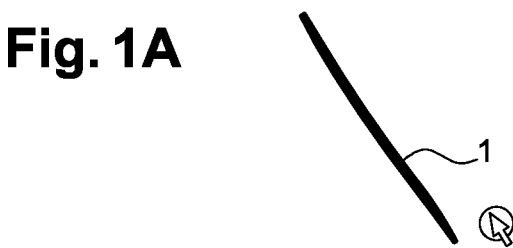
FIGS. 1A, 1B, 1C, 1D, and 1E illustrate an example of design of a rectangular cuboid with the invented method.

A first example of the invented method is disclosed in relation with FIGS. 1A-1E. As illustrated by FIG. 1A, a stroke 1 is sketched by the user in a sketching environment, such as a CAD tool, by means of a mouse, an appendage, or any suitable input means (step a), FIG. 9).

By using a mouse, the user drags the pointer, i.e. a combination of displacement of the mouse and long press on one of the mouse buttons. In touch mode, by using a touchscreen, the user moves the appendage (stylus or finger) on the touchscreen, with a maintained contact between them.

Figure 1B:
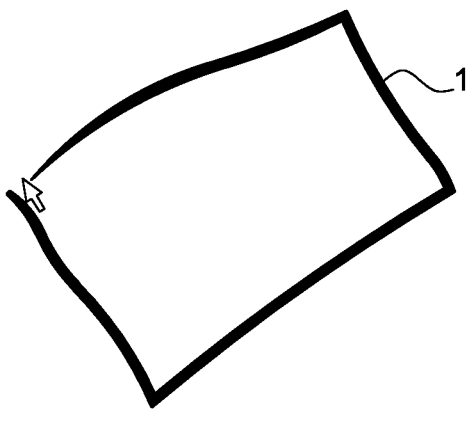

In FIG. 1B, the user continues sketching with three other strokes. It can be noted that the sketch may contain a plurality of strokes. In the present embodiments, the user can indicate when he starts drawing a new shape, in order not to mix strokes from different parts of a complex drawing. For example, the user may select a dedicated command in a menu, or he may use a dedicated shortcut.

The one or more strokes of the user's 2D sketch are received in a same plane, i.e. the near plane of the viewing frustum, and represent a 3D shape from a perspective view of the user. The user's 2D sketch is displayed on the computer's screen. The near plane is perpendicular to the sight of view direction of the user from the viewpoint. Although the sketch may be incomplete, a 3D primitive may be derived based on the partial information of the incomplete sketch (step b), FIG. 9), and displayed on the screen.

The Convolutional Neural Network (CNN) encoder which is disclosed in the patent application EP3958162A1 uses those partial information and the learned patterns to encode the 2D sketch into data defining a 3D model. Other solutions which provide a real time 3D model based on a 2D sketch may be envisioned.

Figure 1C:
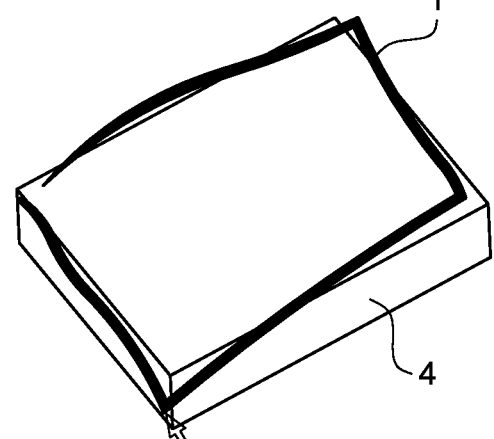

For example, in FIG. 1C, the 3D primitive is a parallelepiped, which is oriented and positioned so as to match the viewpoint of the perspective of the 3D shape. An inference may be computed after each stroke, i.e. when the contact between the appendage and the touch screen is released, or when the mouse press is released. Alternatively, the inference may be periodically computed. In both embodiments, a 3D primitive may be displayed, even though the user has not finished sketching.

Figure 9:
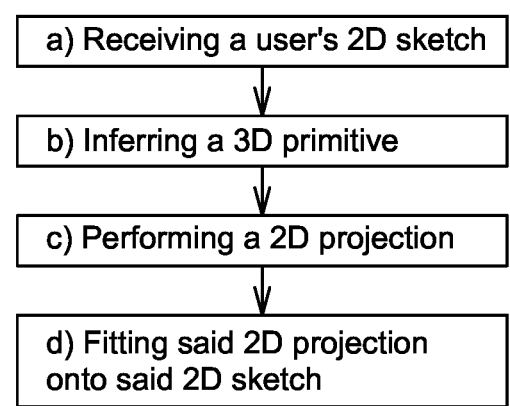
FIG. 9 illustrates a flow chart of the invented method.

Then, the 3D primitive is projected on the near plane (step c), FIG. 9), and fitted onto the 2D sketch (step d), FIG. 9). Thus, the user receives, on the screen, a real-time feedback of the 3D primitive, which is superimposed on the 2D sketch, which helps the user visualizing and correcting the current 3D reconstructed model.

The Convolutional Neural Network (CNN) encoder which is disclosed in the patent application EP3958162A1 infers a real time 3D primitive, thus the user receives a real-time feedback of the 3D primitive. Thanks to the invented method, the design process is not interrupted, and the user can continuously sketch while being guided by the proposed inference.

Indeed, using a Deep Learning architecture allows fast result computation (less than one second of computation time), thereby leveraging GPU acceleration.

Figure 1D:
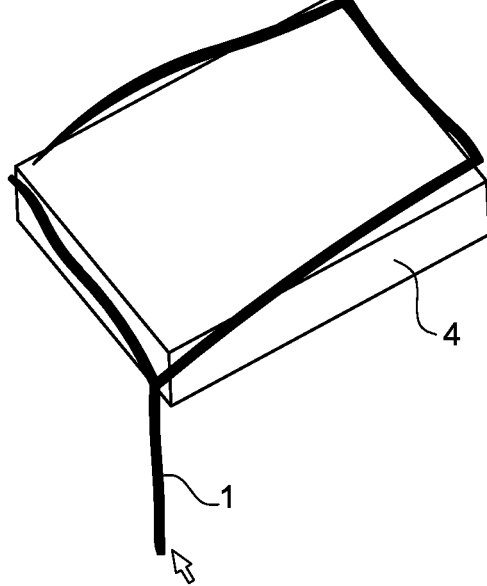
Figure 1E:
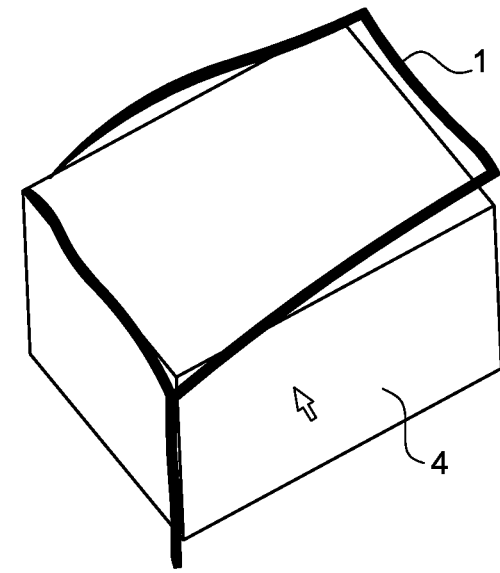

In FIG. 1D, another stroke, which starts from one of the corners of the 2D sketch, is provided by the user. Again, the 3D primitive is inferred based on the new stroke, as it can be seen in FIG. 1E.

Optionally, the transformation of the primitive's 2D projection (the way the primitive's 2D projection is fitted onto the 2D sketch, for example with a translation and scaling) is reflected on the 3D primitive. Alternatively, the 3D primitive is directly modified during the user's sketch, so that its projection, which is computed after each stroke, fits the 2D sketch. That alternative is however more complex because it requires differentiable rendering tools in order to know how to modify the 3D parameters from a 2D error.

The 2D projection which is fitted onto the 2D sketch may be a perspective projection or an orthographic projection of the 3D primitive in the near plane of the viewing frustum. It is reminded that the near plane is the plane perpendicularly to the sight of view direction.

It is more difficult to sketch in a perspective view rather than in an orthographic view, thus the disclosure is particularly useful in a perspective view. Besides, where sketching over photos, which are displayed according to a perspective view, drawing in perspective is important. However, the disclosure is not limited to the perspective view. Novice users tend to draw according to an orthographic view (for example with parallel lines and without vanishing points), and it would also be helpful to provide some assistance where sketching in an orthographic view. The choice of perspective view or orthographic view could be left up to the user by means of a dedicated command, and could also be set by default.

Figure 2A:
FIGS. 2A, 2B, 2C and 2D illustrate an example of design of a revolution cylinder with the invented method.
Figure 2B:
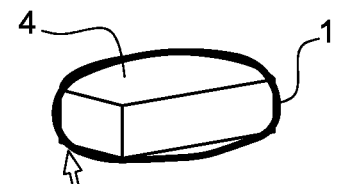
Figure 2C:
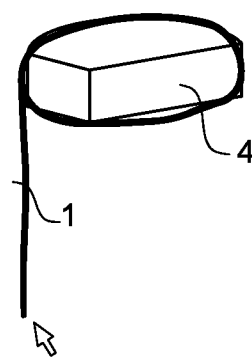
Figure 2D:
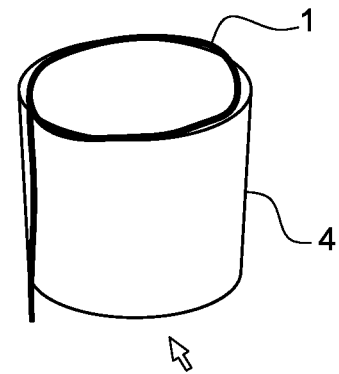

FIGS. 2A, 2B, 2C and 2D illustrate another example of the invented method, with another primitive. In FIG. 2A, the user sketches a flattened circle 1, and the inferred 3D primitive is a half cylinder 4 (FIG. 2B). The user's sketch and the inferred 3D primitive are superimposed; therefore the user receives an instant feedback of his sketch. In FIG. 2C, the user sketches a stroke which starts from the flattened circle, and extends vertically on the screen. As it can be seen in FIG. 2D, a cylinder is inferred from the sketch of a flattened circle and a stroke which extends from the flattened circle.

Other simple yet casual 3D primitives may be inferred from a sketch. The illustrated examples disclose 3D primitives based on the extrusion of a 2D surface, but these shapes can be extended to new primitives by training the neural network using arbitrary user-defined primitives, depending on the needs and domain of expertise of the user.

For example new primitive templates can be added to the dataset, in order to enhance the relevance of the results and to save time. This capability is especially interesting in order to keep the variability of the shapes similar to the ones that a user has been creating in the past.

The deep learning architecture may also be trained with at least one group of 3D models having common structural and/or functional features. For example if a user has been creating many screws, the system could infer a screw from the very first stroke.

The superposition of the 3D primitive on the 2D sketch is achieved by performing a 2D projection of the 3D primitive on the plane of the sketch (step c)), and by fitting the 2D projection onto the 2D sketch (step d)).

In a further embodiment, the distance between the near plane and the 3D primitive may be set based on a representative size of the 3D models of the group of the deep learning architecture. This avoids that the user zooms in or zooms out in the 3D scene once the 3D primitive has been inferred.

Several embodiments are considered in order to fit the 2D projection with the 2D sketch.

Figure 3:
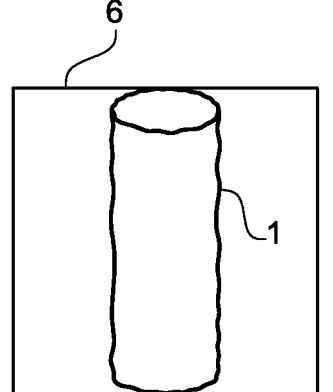
FIG. 3 illustrates the step of fitting the 2D projection of the 3D primitive onto said 2D sketch, by using bounding squares.
Figure 3:
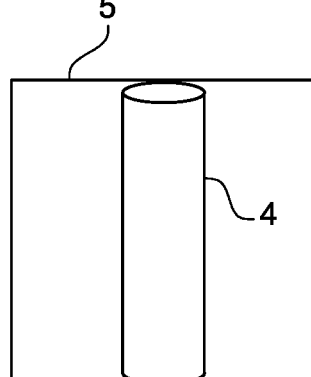
Figure 3:
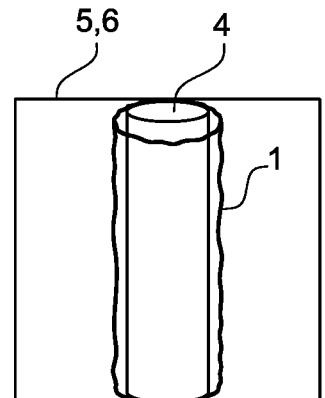

According to a first embodiment, which is illustrated by FIG. 3, step d) of fitting the 2D projection onto the 2D sketch comprises a first sub-step of computing a first 2D bounding square 5 of the 2D projection (cf. central part of FIG. 3).

In a second sub-step, a second 2D bounding square 6 of the 2D sketch 1 is computed (left part of FIG. 3). The second 2D bounding square is the smallest square which encloses the 2D sketch. The first and second 2D bounding squares may be computed at the same time.

Fitting the 2D projection of the 3D primitive onto the 2D sketch may be done, in an embodiment, by translating the first 2D bounding square 5 in the plane such that the center of the first 2D bounding square 5 and the center of the second 2D bounding square 6 coincide, and uniformly scaling the first 2D bounding square 5 such that the length of its side fits the length of the side of the second 2D bounding square 6, i.e. the side lengths of the first 2D bounding square 5 and the second 2D bounding square 6 are equal.

The translation may be operated before the uniform scaling, or conversely, or even at the same time.

It can be noted that the inferred 3D primitive may displayed only once the 2D projection fits onto the 2D sketch, so that the user immediately sees the superposition of the 3D primitive and the 2D sketch.

In order to assist the user, the fitted 2D projection is displayed in transparency (or partial transparency) onto his current sketch, to inspire the user, and help him to complete or correct his drawing.

Figure 4:
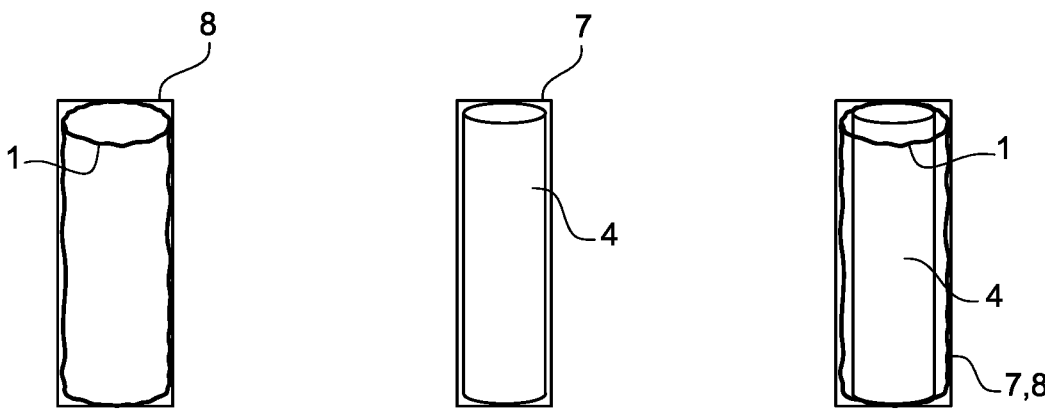
FIG. 4 illustrates the step of fitting the 2D projection of the 3D primitive onto said 2D sketch, by using bounding rectangles.

According to a second embodiment, which is illustrated by FIG. 4, a first 2D bounding rectangle 7 of the 2D projection is computed (cf. central part of FIG. 4). A second 2D bounding rectangle 8 of the 2D sketch 1 is computed (left part of FIG. 3). The second 2D bounding rectangle is the rectangle having the smallest sides, which encloses all the points of the 2D sketch.

The first 2D bounding rectangle 7 is translated in the plane such that its center and the center of the second 2D bounding rectangle 8 coincide. The first 2D bounding rectangle 7 is uniformly scaled such that the length of one among its long side or short side fits the length of the corresponding side of the second 2D bounding rectangle 8. By "corresponding side", it is understood that the scaling is done such that the length of the long side of the first 2D bounding rectangle 7 is equal to the length of the long side second 2D bounding rectangle 8, or the length of the short side of the first 2D bounding rectangle 7 is equal to the length of the short side second 2D bounding rectangle 8.

The translation may be operated before the uniform scaling, or conversely, or even at the same time.

In FIG. 4, the sides of the bounding rectangles are arranged vertically and horizontally, since the 3D primitive and the 2D sketch extend essentially vertically. Other orientations of the bounding rectangles may be considered.

For example, for the first 2D bounding rectangle, the orientation may be the one for which the area of the 2D bounding rectangle is minimized. Then, the orientation of the second 2D bounding rectangle may be the same as the orientation of the first 2D bounding rectangle. Alternatively, the orientation of the second 2D bounding rectangle may be firstly determined.

Alternatively, the orientation of one of the 2D bounding rectangle may be computed by considering the orientation for which the length of the sides is the smallest.

Fitting two bounding squares one to the other or fitting two bounding rectangles one to the other is not a time-consuming process, therefore it is fully compatible with a real-time implementation.

Figure 5:
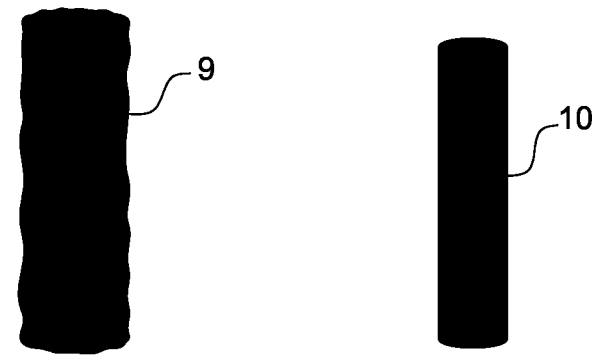
FIG. 5 illustrates the step of fitting the 2D projection of the 3D primitive onto said 2D sketch, by using binary masks.

In another embodiment, which is illustrated by FIG. 5, step d) comprises computing a first 2D binary mask 9 of a envelope of the 2D sketch 1, and computing a second 2D binary mask 10 of the of the 3D primitive's 2D projection, The masks may be computed one following the other, or at the same time.

The binary masks may be computed by using a convex hull or a concave hull of the 2D sketch and 3D primitive's 2D projection. If the 2D sketch is partial, or even very partial, it is possible to use a convex hull. If the 2D sketch is complete, it would be better to use a concave hull (the concave hull has a smaller area and represents a more natural boundary, compared to the convex hull).

A 2D sketch is defined as being partial or incomplete when the set of strokes has at least one discontinuity.

Then, the 3D primitive's 2D projection is fitted onto the 2D sketch by translating the second 2D binary mask 10 in the plane and uniformly scaling the second 2D binary mask 10 so as to maximize an overlapping of the first 9 and second 10 2D binary masks.

In a particular embodiment, an intersection over union function IoU(x, y, s), which is defined below, is used, for determining the overlapping of the binary masks:

$$IoU(x, y, s) = 1 - \frac{Mask_1 * Mask_2(x, y, s)}{Mask_1 + Mask_2(x, y, s) - Mask_1 * Mask_2(x, y, s)}$$

$Mask_1$ is the first 2D binary mask 9, $Mask_2$ is the second 2D binary mask 10 which is translated by x along one axis (e.g. horizontal axis of the screen) and by y along another axis (e.g. vertical axis of the screen) and which is uniformly resized according to a factor s with regards to the first 2D binary mask 9.

"+", "−" and "*" are pixel-wise operations, respectively pixel to pixel addition, pixel to pixel subtraction, and pixel to pixel multiplication, by considering that the images which contain both binary masks have the same size.

The parameters x, y and s are determined so as to have an intersection over union function which tends towards 1.

Any other function which compares two binary masks could be used, for example the Generalized intersection over union (GIoU).

The third embodiment, which is based on the binary masks may be more time-consuming than the first and second embodiments, respectively based on the bounding square and rectangle, but it may provide better results, thanks to the error minimization calculation.

The first or second embodiment may be combined with the third embodiment. For example, the first or second embodiment may be implemented when the user starts sketching a first set of strokes, in order to quickly provide a 3D primitive which is fitted onto the 2D sketch. For example, referring to FIGS. 1A-1E and 2A-D, the first or second embodiment may be implemented when the user respectively sketches the rectangle or the flattened circle. Then, the third embodiment may be implemented when the user refines his sketch, with a second set of strokes. Referring to FIGS. 1A-1E and 2A-D, the third embodiment may be implemented when the user starts drawing the vertical stroke.

The user may switch from one embodiment to the other, if he considers that the 3D primitive is not centered enough with regards to the 2D sketch.

Figure 6:
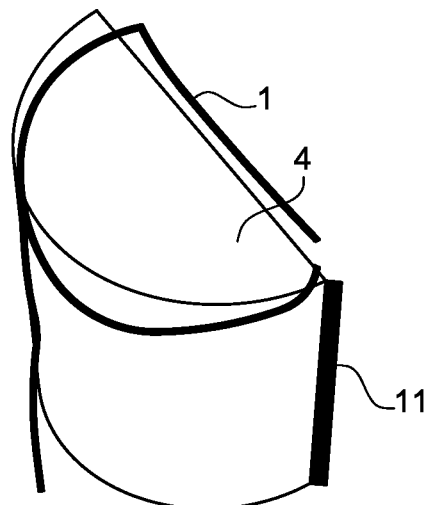
FIG. 6 illustrates the step of replacing the edge of the 2D sketch by the edge of the 2D projection.

In an embodiment, which is illustrated by FIG. 6, the user may correct and/or complete his 2D sketch by using one of the edges 11 of the 3D primitive. For that, the user provides an input for selecting the edge, for example with a double-click on the edge 11, or by pressing both left and right buttons of the mouse, or with a long tap on the edge 11 in touch mode.

If the location of the user's input is close to an edge of the 3D's primitive projection (e.g. by considering a distance inferior to a predetermined threshold), the edge is added to the 2D sketch. Alternatively, an edge of the primitive, which fits at least partially onto an edge of the 2D sketch, may replace the edge of the 2D sketch.

Advantageously, when the user hovers the pointer (mouse pointer or appendage in touch mode) over one of the edges of the 3D's primitive projection, there may be a visual feedback on the edge, such as a highlighting of the edge.

The user may also select the complete shape as it has been predicted, and thus replace all current user strokes with the strokes of the complete inferred shape. This can be achieved by double-clicking on the displayed silhouette or even on a button to validate the result. Since the 2D projection and the 2D sketch overlap, the user can easily switch from the 2D sketch to the 3D primitive, which contributes to the inter-activity of the method.

Figure 7:
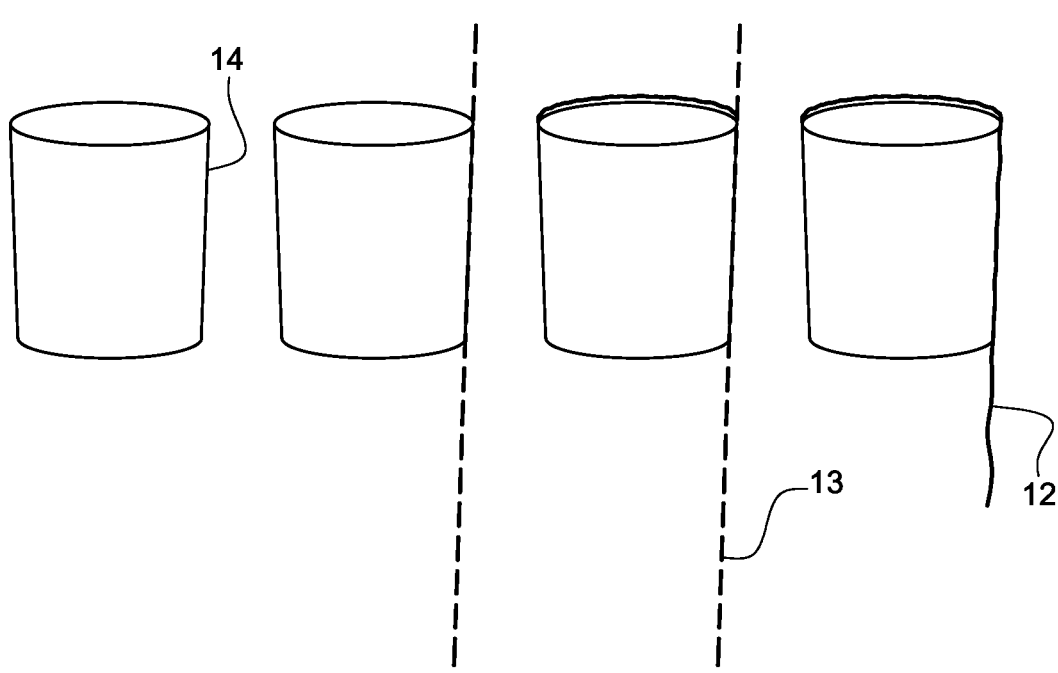
FIG. 7 illustrates an embodiment of the method for designing along an edge constraint.

According to another embodiment, which is illustrated by FIG. 7, the user may be guided while sketching. The inferred 3D primitive has at least one edge. One can define an edge constraint for a given edge, which acts as a target for the user's sketches. The edge constraint 13 fits the edge 14, for example by being aligned with the edge 14. Each edge may therefore behave like an infinite ruler, not limited to the visible projected edge.

In FIG. 7, the user has sketched a flattened circle, thus a cylinder has been inferred. One of the parameters of the 3D primitive, i.e. the height of the cylinder, has a default value. An edge constraint is applied to the edge corresponding to the parameter.

When a user's sketch 12 is received at a distance to the edge of the 2D projection which is inferior to a predetermined threshold, the edge constraint 13 "attracts" the user's sketches. The edge constraint 13 may act as an infinite line constraint, guiding and snapping the stroke of the user to the edge constraint 13. Then, a new inference of the 3D primitive is computed, based on the additional user's sketch along the edge constraint.

Therefore, the invented method enables the user to quickly design 3D shapes with a very limited number of inputs, and even with partial inputs. All interactions are kept as simple and in two dimensions as possible, and the complexity of 3D is not visible from the user.

The user may design an assembly of 3D models by repeating the aforementioned steps of designing one 3D model. As mentioned previously, the user must provide a specific input for designing another 3D model; otherwise it would be interpreted as a correction of the current 3D model, thus causing a new inference.

Figure 8:
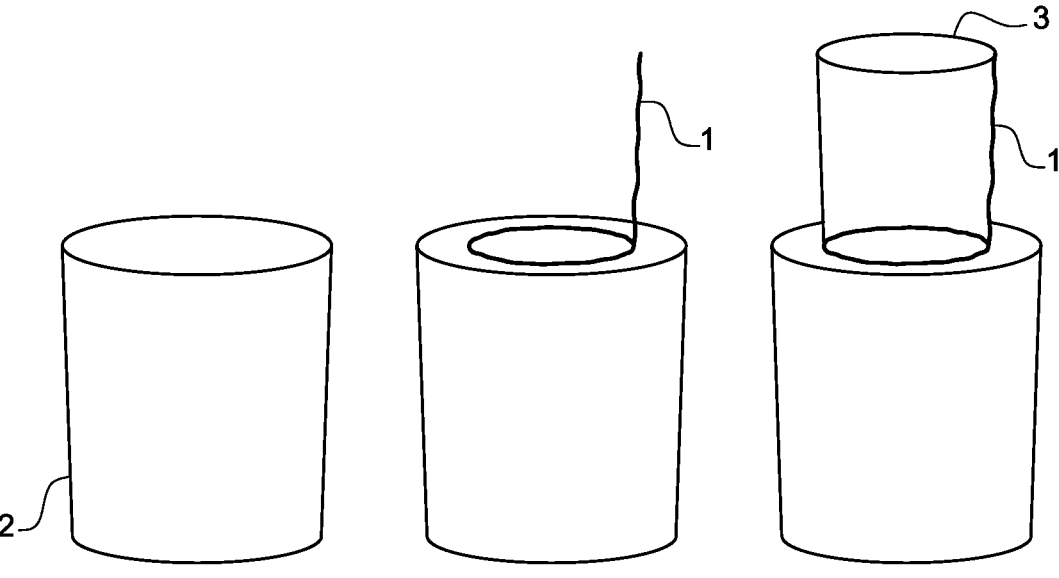
FIG. 8 illustrates an embodiment of the method for designing a set of 3D models.

The method for designing a set of 3D models, which is illustrated, as an example by FIG. 8, comprises a first step of designing a first 3D model 2 by using the aforementioned method. Then, in a second step, a second 3D model 3 is designed by using the aforementioned method. A 3D constraint is detected between the first 3D model 2 and the second 3D model 3. On FIG. 8, the 3D constraint is a co-planarity of the upper base of the first 3D model 2 and the lower base of the second 3D model 3. The 3D position and/or the orientation of the second 3D model 3 is modified (snapped) based on said 3D constraint, which can be, for example at least one among co-planarity, contact, co-axiality, parallelism, symmetry.

It can be noted that 2D snapping tools already exist, to favor the 2D perpendicularity of two strokes for example. However, in perspective view, these notions of perpendicularity or 2D parallelism are no longer valid, since parallel lines in three dimensions meet at a vanishing point in perspective view. The invented method enables snapping in perspective view, as it directly interacts with the 3D model in the 3D scene.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 10:
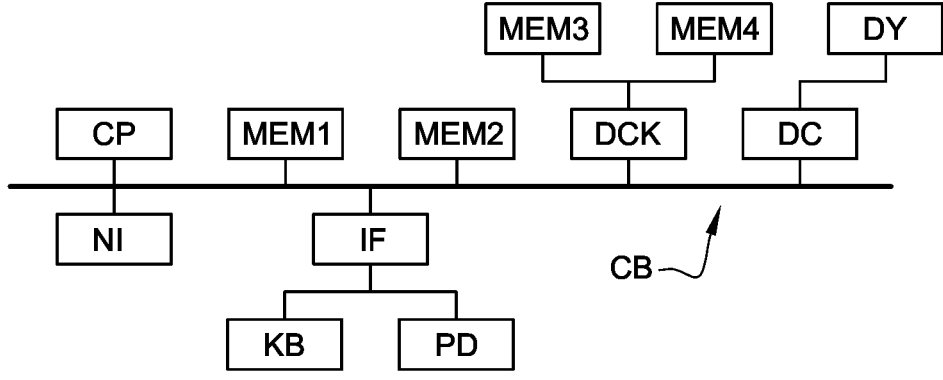
FIG. 10 illustrates a computer for carrying out the invented method.

A computer—more precisely a computer aided design station—suitable for carrying out a method according to an exemplary embodiment is described with reference to FIG. 10. In FIG. 10, the computer includes a Central Processing Unit CP which performs the processes described above. The process can be stored as an executable program, i.e. a set of computer-readable instructions in memory, such as RAM MEM1 or ROM MEM2, or on hard disk drive (HDD) MEM3, DVD/CD drive MEM4, or can be stored remotely. 3D models database in a form suitable to be processed by the executable program according to the inventive method—may also be stored on one or more of memory devices MEM1 to MEM4, or remotely.

The claimed invention is not limited by the form of the computer-readable media on which the computer-readable instructions of the inventive process are stored. For example, the instructions and databases can be stored on CDs, DVDs, in FLASH memory, RAM, ROM, PROM, EPROM, EEPROM, hard disk or any other information processing device with which the computer aided design station communicates, such as a server or computer. The program and the database can be stored on a same memory device or on different memory devices.

Further, a computer program suitable for carrying out the inventive method can be provided as a utility application, background daemon, or component of an operating system, or combination thereof, executing in conjunction with CPU PR and an operating system such as Microsoft VISTA, Microsoft Windows 7, UNIX, Solaris, LINUX, Apple MAC-OS and other systems known to those skilled in the art.

The Central Processing Unit CP can be a Xenon processor from Intel of America or an Opteron processor from AMD of America, or can be other processor types, such as a Freescale ColdFire, IMX, or ARM processor from Freescale Corporation of America. Alternatively, the Central Processing Unit CP can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The computer aided design station in FIG. 10 also includes a network interface NI, such as an Intel Ethernet PRO network interface card from Intel Corporation of America, for interfacing with a network, such as a local area network (LAN), wide area network (WAN), the Internet and the like. The computer aided design station further includes a display controller DC, such as a NVIDIA GeForce GTX graphics adaptor from NVIDIA Corporation of America for interfacing with display DY, such as a Hewlett Packard HPL2445w LCD monitor or a virtual reality headset. A general purpose I/O interface IF interfaces with a keyboard KB and pointing device PD, such as a roller ball, mouse, touchpad, control devices of a virtual reality system and the like. The display, the keyboard and the pointing device, together with the display controller and the I/O interfaces, form a graphical user interface.

The disclosure may also be implemented in touch mode, wherein a computer system comprises a touch sensitive display for displaying the 3D scene and detecting interactions of one the appendages.

The user sketches one the plane by means of the pointing device PD, with the touchpad. The 2D sketch can be seen on the display DY.

The disclosure could also be implemented in an immersive environment. In that case, the computer system comprises a virtual reality headset, which is worn by the user, for displaying the 3D scene. The different user interactions may be detected by means of control devices, which may be equipped with buttons so as to detect a tap gesture, a drag or a hold gesture. The computer system may also comprise sensing devices, such as infrared sensors, in order to determine the location of the control devices.

Disk controller DKC connects HDD MEM3 and DVD/CD MEM4 with communication bus CB, which can be an ISA, EISA, VESA, PCI, or similar, for interconnecting all of the components of the computer aided design station.

The computer also comprises a memory having recorded thereon the data structure which comprises the Convolutional Neural Network (CNN) encoder which infers the 3D primitive based on the 2D sketch and based on the learned patterns. The skilled person may refer to patent application EP3958162A1 for an exemplary description of the encoder.

The designed 3D model, or the assembly of 3D designed model, may be stored on CDs, DVDs, in FLASH memory, RAM, ROM, PROM, EPROM, EEPROM, hard disk or any other server or computer, for a further use in a computer aided design. A physical object may be manufactured based on a file containing the 3D model. The file may be converted in a readable format for the manufacturing process.

A description of the general features and functionality of the display, keyboard, pointing device, as well as the display controller, disk controller, network interface and I/O interface is omitted herein for brevity as these features are known.

Figure 11:
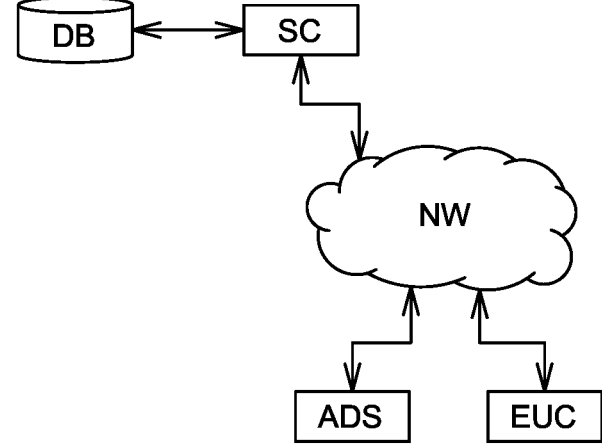
FIG. 11 is a block diagram of a computer system suitable for carrying out a method.

FIG. 11 is a block diagram of a computer system suitable for carrying out a method according to a different exemplary embodiment.

In FIG. 11, the server SC is connected to an administrator system ADS and end user computer EUC via a network NW.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses the 3D model databases on the server via the network NW.

Although only one administrator system ADS and one end user system EUX are shown, the system can support any number of administrator systems and/or end user systems without limitation.

Any processes, descriptions or blocks in flowcharts described herein should be understood as representing modules, segments, or portions of code which include one or more executable instructions for implementing specific logical functions or steps in the process, and alternate implementations are included within the scope of the exemplary embodiment.

The invention claimed is:

1. A computer-implemented method for designing at least one 3D model in a 3D scene, comprising:
   a) receiving a user's 2D sketch and displaying the 2D sketch on a plane, the 2D sketch representing a view of the 3D model to be designed;
   b) inferring a 3D primitive based on the 2D sketch, the 3D primitive being oriented and positioned in the 3D scene to match said view;
   c) performing a 2D projection of the 3D primitive on the plane; and
   d) fitting said 2D projection onto said 2D sketch,
   wherein step d) further comprises:
   computing a first 2D bounding square of the 2D projection;
   computing a second 2D bounding square of the 2D sketch;
   translating the first 2D bounding square in the plane such that a center of the first 2D bounding square and a center of the second 2D bounding square coincide; and
   uniformly scaling the first 2D bounding square such that a length of a side of the first 2D bounding square fits a length of the side of the second 2D bounding square.

2. The computer-implemented method according to claim 1, wherein, the 2D projection includes at least one edge being a first edge, which fits at least partially onto an edge of the 2D sketch being a second edge, and
   wherein the method further comprises:
   receiving a user's input which includes selecting the first edge; and
   replacing the second edge by the first edge.

3. The computer-implemented method according to claim 1, further comprising:
   obtaining an edge constraint which fits an edge of the 2D projection;
   receiving a second user's sketch at a distance to the edge of the 2D projection which is inferior to a predetermined threshold; and
   snapping the second user's sketch to the edge constraint.

4. The computer-implemented method according to claim 1, wherein the 2D sketch includes a plurality of strokes, steps a)-d) being iterated after each stroke.

5. The computer-implemented method according to claim 1, wherein the 3D primitive is inferred by using a deep learning model, the deep learning model being trained with at least one group of 3D models having common structural or functional features.

6. The computer-implemented method according to claim 5, further comprising setting a distance between the plane and the 3D primitive based on a representative size of the 3D models of the group.

7. A method for designing a set of 3D models, comprising:
designing a first 3D model using the method according to claim 1;
designing a second 3D model;
detecting a 3D constraint between the first 3D model and the second 3D model; and
modifying the 3D position or orientation of one among: the first 3D model and the second 3D model based on said 3D constraint,
wherein the first and second 3D model are each designed by:
a) receiving a user's 2D sketch and displaying the 2D sketch on a plane, the 2D sketch representing a view of the 3D model to be designed;
b) inferring a 3D primitive based on the 2D sketch, the 3D primitive being oriented and positioned in a 3D scene to match said view;
c) performing a 2D projection of the 3D primitive on the plane; and
d) fitting said 2D projection onto said 2D sketch.

8. The method for designing the set of 3D models according to claim 7, wherein the 3D constraint is at least one among: co-planarity, contact, co-axiality, parallelism, and symmetry.

9. A non-transitory computer-readable data-storage medium having stored thereon computer-executable instructions that when executed by a computer system cause the computer system to carry out the method according to claim 1.

10. The computer-implemented method according to claim 1, wherein the user's 2D sketch includes at least a first set of strokes and a second set of strokes, and
wherein step d) is implemented for the first set of strokes; and said method further comprising, for the first set of strokes and for the second set of strokes:
computing a first 2D binary mask of an envelope of the 2D sketch;
computing a second 2D binary mask of an envelope of the 2D projection; and
translating a second 2D binary mask in the plane and uniformly scaling the second 2D binary mask to maximize an overlapping of the first and second 2D binary masks.

11. A computer-implemented method for designing at least one 3D model in a 3D scene, comprising:
a) receiving a user's 2D sketch and displaying the 2D sketch on a plane, the 2D sketch representing a view of the 3D model to be designed;
b) inferring a 3D primitive based on the 2D sketch, the 3D primitive being oriented and positioned in the 3D scene to match said view;
c) performing a 2D projection of the 3D primitive on the plane; and
d) fitting said 2D projection onto said 2D sketch, wherein step d) further comprises:
computing a first 2D bounding rectangle of the 2D projection;
computing a second 2D bounding rectangle of the 2D sketch;
translating the first 2D bounding rectangle in the plane such that a center of the first 2D bounding rectangle and a center of the second 2D bounding rectangle coincide; and
uniformly scaling the first 2D bounding rectangle such that a length of one among a long side or short side of the first 2D bounding rectangle fits a length of a corresponding side of the second 2D bounding rectangle.

12. The computer-implemented method according to claim 11, wherein the user's 2D sketch includes at least a first set of strokes and a second set of strokes, and
wherein step d) is implemented for the first set of strokes; and said method further comprising, for the first set of strokes and for the second set of strokes:
computing a first 2D binary mask of an envelope of the 2D sketch;
computing a second 2D binary mask of an envelope of the 2D projection; and
translating a second 2D binary mask in the plane and uniformly scaling the second 2D binary mask to maximize an overlapping of first and second 2D binary masks.

13. The computer-implemented method according to claim 11, wherein, the 2D projection includes at least one edge being a first edge, which fits at least partially onto an edge of the 2D sketch being a second edge, and
wherein the method further comprises:
receiving a user's input which includes selecting the first edge; and
replacing the second edge by the first edge.

14. A computer system comprising:
a processor coupled to a memory, the memory storing computer-executable instructions that when executed by the processor cause the processor to be configured to:
receive a user's 2D sketch and displaying the 2D sketch on a plane, the 2D sketch representing a view of a 3D model to be designed;
infer a 3D primitive based on the 2D sketch, the 3D primitive being oriented and positioned in a 3D scene to match said view;
perform a 2D projection of the 3D primitive on the plane; and
fit said 2D projection onto said 2D sketch,
wherein the processor is further configured to:
compute a first 2D bounding square of the 2D projection;
compute a second 2D bounding square of the 2D sketch;
translate the first 2D bounding square in the plane such that a center of the first 2D bounding square and a center of the second 2D bounding square coincide; and
uniformly scale the first 2D bounding square such that a length of a side of the first 2D bounding square fits a length of the side of the second 2D bounding square.

* * * * *